United States Patent
Rasoulian et al.

(10) Patent No.: US 6,615,163 B1
(45) Date of Patent: Sep. 2, 2003

(54) SYSTEM AND METHOD FOR DEVELOPING TESTING CONFIGURATIONS

(75) Inventors: Hamid Rasoulian, Austin, TX (US); Stephen A. Osella, Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/459,819

(22) Filed: Dec. 13, 1999

(51) Int. Cl.⁷ .............................................. G06F 15/00
(52) U.S. Cl. ............................ 702/196; 341/50; 345/97
(58) Field of Search ................................. 702/196, 118, 702/120, 126; 370/203; 341/50, 58; 382/281; 708/410; 345/97, 100; 324/238; 375/240.18

(56) References Cited

U.S. PATENT DOCUMENTS

| | | | | |
|---|---|---|---|---|
| 3,795,864 A | * | 3/1974 | Fullton, Jr. ................. | 708/410 |
| 3,976,826 A | * | 8/1976 | Fullton, Jr. ............. | 375/240.18 |
| 4,084,136 A | * | 4/1978 | Libby et al. ................ | 324/238 |
| 4,357,677 A | * | 11/1982 | Rebourg ..................... | 708/820 |
| 4,513,288 A | * | 4/1985 | Weathers et al. .......... | 343/17.2 |
| 5,159,600 A | | 10/1992 | Chintapalli et al. ........... | 371/27 |
| 5,311,176 A | * | 5/1994 | Gurney ........................ | 341/50 |
| 5,329,279 A | * | 7/1994 | Barbu et al. .................. | 341/50 |
| 5,497,395 A | * | 3/1996 | Jou ............................. | 375/205 |
| 5,542,043 A | | 7/1996 | Cohen et al. .......... | 395/183.08 |
| 5,726,925 A | * | 3/1998 | Hyun et al. ............. | 364/727.01 |
| 5,900,856 A | * | 5/1999 | Iino et al. .................... | 345/100 |
| 6,069,574 A | * | 5/2000 | Eo et al. ........................ | 341/50 |
| 6,181,310 B1 | * | 1/2001 | Nomura ........................ | 345/97 |

OTHER PUBLICATIONS

Ghafoor, Aug. 1989, IEEE, vol. 38, No. 8, pg 1164–1171.*
Kuroyanagi, 1993, IEEE, pg 41–46.*
Breyfogle, "Statistical Methods for Testing, Development, and Manufacturing," pp. 273–289.
Breyfogle, et al., "Pass/Fail Functional Testing and Associated Test Coverage," *Quality Engineering* 4(2), pp. 227–234.

* cited by examiner

*Primary Examiner*—Marc S. Hoff
*Assistant Examiner*—Paul Kim
(74) *Attorney, Agent, or Firm*—Baker Botts L.L.P.

(57) ABSTRACT

A method for developing testing configurations and a computer system operable to implement the same. The method includes the steps of identifying factors to be tested and levels for each factor; selecting a Hadamard matrix of an appropriate size such that for any integer 1, 2 . . . n, the Hadamard matrix has a size $2^n$ and at least $(2^n-1)$ columns, and maintains orthogonality of at least strength n when columns are selected sequentially; and creating a configuration matrix from the selected Hadamard matrix. The configuration matrix is created by first creating an integer matrix from the Hadamard matrix by combining columns of the Hadamard matrix where necessary, and replacing unassigned variables in the integer matrix in a manner that improves coverages. In one embodiment, a frequency matrix and a proportionality matrix are used to improve coverage when replacing unassigned variables.

35 Claims, 2 Drawing Sheets

SYSTEM AND METHOD FOR DEVELOPING TESTING CONFIGURATIONS

TECHNICAL FIELD

The system and method described herein relates generally to the field of testing, and more particularly, to developing testing configurations for compatibility testing.

BACKGROUND

In today's world, intense competition in many industries places significant pressure on companies and their employees to both reduce product development and testing cycle times, while at the same time many products are increasing in complexity. Further, in many industries the trend has been a demand from customers for companies to provide wide ranges of choices for customers, such as to allow customers the ability to select one particular type of component from a choice of many, for each of several different components present in a product. For example, in the computer industry customers may wish to purchase a computer system, but specify, for example, the specific type of central processing unit (CPU) the system will include, the amount of memory, different types of software, and many other features.

When multiple variations of multiple components can be selected companies must, to the best of their ability, test each possible combination to ensure that the different components are compatible with one another, and that the system will function satisfactorily with that particular selection of components. When the number of selections is not too large, testing each combination may be possible. However, where the number of configurations is large, testing of each configuration of components is neither possible nor practical. Under these circumstances, an efficient system and method for selecting a reasonable number of configurations is desired such that the maximum number of combinations of components can be examined with minimum number of tests or trials.

In the context of testing compatibility, whether in the computer industry or otherwise, the result of any test is either pass or fail rather than a quantitative result. Under these circumstances confounding effect is of no interest, as is the case when there are multiple variables and a quantitative result is sought. Thus, when designing configuration tests, the objective is to select a minimum set of configurations that will examine the greatest number of combinations of components, thus avoiding redundancy and at the same time avoiding holes in the test space, thereby increasing test efficiency.

By maximizing the coverage there is a better chance to achieve a greater number of failures. For example, if three different selections are available for each of two different components (selection 1, 2 or 3 for the first component and selection A, B or C for the second component), there are a total of six different variables and nine possible combinations. In configuration testing, the components are referred to as "factors" while the selections are referred to as "levels." It is most desirable to ensure that each of the six different levels appear in at least one test. If this occurs, there will be 100% coverage for each level taken individually, and after completing the testing it will be known with certainty whether each level, taken alone, will cause the system as a whole to fail.

The second level of coverage is every conceivable combination of two variables, i.e., 1A; 1B; 1C; 2A; 2B; 2C; 3A; 3B; and 3C. 100% coverage would ensure that any combination of two will be covered in the trials. Although with large numbers of configurations 100% coverage at the first, second, and all subsequent levels is not possible, the objective is most importantly to maximize coverage at the first level, second most importantly to maximize coverage at the second level, and so on.

In developing testing configurations, matrices are often used in which individual columns represent the possible factors, rows represent the number of trials, and the entries in the matrix represent the combination of levels (the "level combination") for any given trial. For example, for a system that includes two factors (F1, F2) each of which have two levels (L1, L2), a testing matrix could be as follows:

|   | F1 | F2 |
|---|----|----|
| 1 | L1 | L1 |
| 2 | L1 | L2 |
| 3 | L2 | L1 |
| 4 | L2 | L2 |

For factors having two levels, entries in the matrix can be replaced by 1's or 0's to provide the following matrix:

|   | F1 | F2 |
|---|----|----|
| 1 | 0  | 0  |
| 2 | 0  | 1  |
| 3 | 1  | 0  |
| 4 | 1  | 1  | where 0 represents L1 and 1 represents L2. Note that all possible combinations can be covered (100% coverage) in four trials. In choosing how to populate a testing matrix the objective in configuration testing is to populate the matrix in such a way that coverage is maximized for the number of trials.

In achieving this objective of maximizing coverage, the principle of orthogonality is always important. An orthogonal array is an array of 1's and 0's that for strength n has the property that for any n number of columns selected all possible combinations of 1's and 0's will appear an equal number of times. For example, for an orthogonal array of strength 2, when selecting any two columns all possible combinations of 1's and 0's (00, 01, 10, and 11) will appear an equal number of times. Thus, an orthogonal array of strength n not only helps ensure that certain combinations of variables are not disproportionately tested, but also ensures 100% coverage for any combination of n different variables. Degradation of orthogonality for any testing matrix represents an imbalance in the variables represented in the trials and, therefore, can cause less than desirable coverage. Thus, it is desirable to maintain orthogonality of the highest strength in a testing matrix for the least number of trials.

A well known limitation of orthogonal arrays, however, is that orthogonal arrays of size $2^n$ can have only n+1 independent orthogonal arrays of strength n. For example, to maintain a strength of 3 (n=3), an orthogonal array of vector size 8 ($2^3$) can have only 4 (3+1) columns. In other words, for only 4 columns will the property hold true that in any 3 out of the 4 columns all possibilities of 1's and 0's (000, 001, 010, 100, 011, 101, 110, and 111) will appear an equal number of times. In testing configuration matrices, 4 columns represents only four bi-level factors. It would, of course, be desirable to maintain orthogonality across a larger number of factors for the same number of trials.

In developing configuration testing matrices, it has been discovered that Hadamard matrices are useful in populating the matrix, particularly for pass/fail testing applications. Hadamard matrices are square matrices of order n whose entries are (+)'s and (−)'s. If we replace (+) with 1 and (−) with 0 they will be orthogonal arrays of strength two, that have the property HH'=nI, where I is an identity matrix. Thus, for any one column or for any two columns in a Hadamard matrix, any given combination of 1's and 0's will appear an equal number of times. Hadamard matrices can easily be used for factors having only two levels since each level can be represented by either a 0 or a 1.

More recently, it has been shown that Hadamard matrices can also be used for variables having more than two levels by combining columns. For example, for a variable having four levels, each level can be represented by the combinations 00, 01, 10, and 11. By combining two columns in the Hadamard matrix each of these combination can be represented. See "Pass/Fail Functional Testing and Associated Test Coverage," Breyfogle, R. W., Quality Engineering 4(2), 1991, pp. 227–234. Combining columns of the Hadamard matrix, particularly in a random fashion, results in degradation of the orthogonal properties of the Hadamard matrix particularly when, for any array size of $2^n$, there are more than n+1 columns (more than n+1 factors).

Another disadvantage of combining columns to account for variables having greater than two levels occurs when the number of levels is not a power of two. For example, for a variable having three levels, those three levels can be represented by 00, 01 and 10, leaving the combination 11 unassigned. Breyfogle teaches that when this unassigned combination is encountered in the Hadamard matrix, the value entered into the corresponding configuration testing matrix that is to be populated should either be randomly assigned to one of the assigned levels, or sequentially assigned to the first level (00) the first time it appears, to the second level the second time it appears, and so on. Such random or sequential assignment is disadvantageous in that it does not contribute in any way toward the objective of maximizing coverage.

SUMMARY OF THE PREFERRED EMBODIMENTS

In accordance with the teachings herein, a new system and method are disclosed for constructing configuration testing matrices that reduces and/or eliminates the disadvantages associated with presently known methods. Such a system and method enables the number of columns to be increased while maintaining orthogonality, and improves coverage percentages. In addition, a new system and method is provided for replacing unassigned variables and exceptions in an integer matrix in a manner that improves coverage percentages.

More particularly, according to one embodiment, a method for developing testing configurations is provided including the steps of identifying factors to be tested and levels for each factor, selecting a Hadamard matrix of an appropriate size such that for any integer 1, 2 . . . n, the Hadamard matrix has a size $2^n$ and $(2^n-1)$ columns, and maintains orthogonality of strength n when columns are selected sequentially, and creating a configuration matrix from the selected Hadamard matrix.

In another embodiment the creating step further includes the steps of first creating an integer matrix from the Hadamard matrix by assigning different columns of the Hadamard matrix to represent different factors, wherein for factors having more than two levels a number X of consecutive columns of the Hadamard matrix is assigned to the factors such that X is the smallest integer for which ($2^X \geq$ the number of levels) for that factor, and for each factor assigning a level index. The method further includes the step of inserting in a corresponding column and row of the integer matrix the level index assigned to the binary codes appearing in the Hadamard matrix.

In yet another embodiment, the creating step further includes the step of inserting an indicator in the integer matrix for each binary code appearing in the Hadamard matrix that is not assigned to a level index.

In yet another embodiment, the integer matrix is an initial integer matrix, and the creating step further includes the step of replacing indicators in the initial integer matrix with assigned level indexes for the corresponding factor, wherein said initial integer matrix becomes a final integer matrix when all such indicators have been replaced.

In yet another embodiment, the replacing step further includes the steps of, for each row in the initial integer matrix having an indicator, replacing that row with a possible replacement level combination in a manner that improves testing coverage.

In yet another embodiment, the step of replacing in a manner that improves coverage further includes the step of determining a subset of all possible replacement level combinations for the row having the indicator. In a further embodiment, the step of replacing in a manner that improves coverage further includes the steps of obtaining a frequency matrix count for each possible replacement level combination, and selecting from the subset each possible replacement level combination having the lowest frequency matrix count. If more than one is selected then, according to yet another embodiment, the step of replacing in a manner that improves coverage further includes the steps of obtaining a proportionality matrix count for each selected possible replacement level combination, and choosing each possible replacement level combination having the lowest proportionality matrix count. If there is more than one chosen possible replacement level combination, then according to one embodiment, the replacing step further includes the step of choosing a single one of the chosen possible replacement level combinations having the lowest proportionality matrix count.

In yet another embodiment, the step of replacing in a manner that improves coverage further includes the step of replacing the row of the initial integer matrix with the selected or chosen possible replacement level combination.

In yet another embodiment, the method for developing testing configurations further includes the steps of calculating coverages based on the final integer matrix, and creating a coverage matrix containing the calculated coverages.

In yet another embodiment, the step of replacing in a manner that improves coverage further includes the steps of removing all excluded level combinations from the subset of possible replacement level combinations and determining if the subset is empty. In yet another embodiment, if the subset is determined to be empty, the replacing step further includes the step of replacing an assigned level index in the row of the initial integer matrix with an indicator.

A computer system is also provided having a processor, memory, an input device, and a configuration generator tool application for developing testing configurations. The configuration generator tool is executable by the computer system, and is operable to receive input data including a number of factors to be tested and levels for each factor from a user through the input device. The configuration generator tool is further operable to select from a group of Hadamard matrices stored in memory a Hadamard matrix of an appropriate size such that for any integer 1, 2 ... n, the Hadamard matrix has a size $2^n$ and ($2^n-1$) columns, and maintains orthogonality of strength n when columns are selected sequentially. The configuration generator tool is further operable to create a testing configuration matrix from the selected Hadamard matrix.

In another embodiment, the configuration generator tool is further operable to create the testing configuration matrix by first creating an integer matrix from the Hadamard matrix by assigning different columns of the Hadamard matrix to represent different factors, wherein for factors having more than two levels a number X of consecutive columns of the Hadamard matrix is assigned to the factors such that X is the smallest integer for which ($2^X \geq$ the number of levels) for that factor, and further assigning a level index to each factor, and inserting in a corresponding column and row of the integer matrix the level index assigned to the binary codes appearing in the Hadamard matrix.

In yet another embodiment, the configuration generator tool is further operable to create the testing configuration matrix by inserting an indicator in the integer matrix for each binary code appearing in the Hadamard matrix that is not assigned to a level index.

In yet another embodiment, the integer matrix is an initial integer matrix, and the configuration generator tool is further operable to create the testing configuration matrix by replacing indicators in the initial integer matrix with assigned level indexes for the corresponding factor, wherein the initial integer matrix becomes a final integer matrix when all such indicators have been replaced.

In yet another embodiment, the configuration generator tool is further operable to create the testing configuration matrix by, for each row in the initial integer matrix, having an indicator, replacing the row having an indicator with a possible replacement level combination in a manner that improves testing coverage.

In yet another embodiment, the configuration generator tool is further operable to replace the row having an indicator in a manner that improves coverage by determining a subset of all possible replacement level combinations for that row. In yet another embodiment the configuration generator tool is further operable to replace the row in a manner that improves coverage by obtaining a frequency matrix count for each possible replacement level combination; and selecting each possible replacement level combination having the lowest frequency matrix count. According to yet another embodiment, if more than one possible replacement level combination is selected, then the configuration generator tool is further operable to perform the replacing step by obtaining a proportionality matrix count for each selected possible replacement level combination, and choosing each possible replacement level combination having the lowest proportionality matrix count. In yet another embodiment, if more than one possible replacement level combinations are chosen, the configuration generator tool is further operable to perform the replacing step by choosing a selected one of the chosen possible replacement level combinations, and, in yet another embodiment, to replace the row of the initial integer matrix with the selected or chosen possible replacement level combination.

In yet another embodiment, the configuration generator tool is further operable to update the frequency and proportionality matrices.

In yet another embodiment, the configuration generator tool is further operable to calculate coverages based on the final integer matrix, and create a coverage matrix containing the calculated coverages.

In yet another embodiment, the configuration generator tool is further operable to receive input data including excluded level combinations, and to replace each row of said initial integer matrix containing excluded level combinations in a manner that improves testing coverage.

According to yet another embodiment, a method of developing testing configurations is provided including the steps of identifying factors to be tested and levels for each factor, selecting a Hadamard matrix of an appropriate size and creating an initial integer matrix from the selected Hadamard matrix by assigning different columns to represent different factors, wherein for factors having more than two levels a number X of consecutive columns of the Hadamard matrix is assigned to the factors such that X is the smallest integer for which ($2^X \geq$ the number of levels) for that factor, and for each factor assigning a level index. The method further includes the steps of inserting in a corresponding column and row of the integer matrix the level index assigned to the binary codes appearing in the Hadamard matrix, and using a frequency matrix and a proportionality matrix to replace each row of said initial integer matrix having an indicator in a manner that improves testing coverage.

BRIEF DESCRIPTION OF THE DRAWINGS

A more complete understanding of the disclosed embodiments and advantages thereof may be acquired by referring to the following description taken in conjunction with the accompanying drawings, in which like reference numbers indicate like features, and wherein.

DETAILED DESCRIPTION

Figure 1:
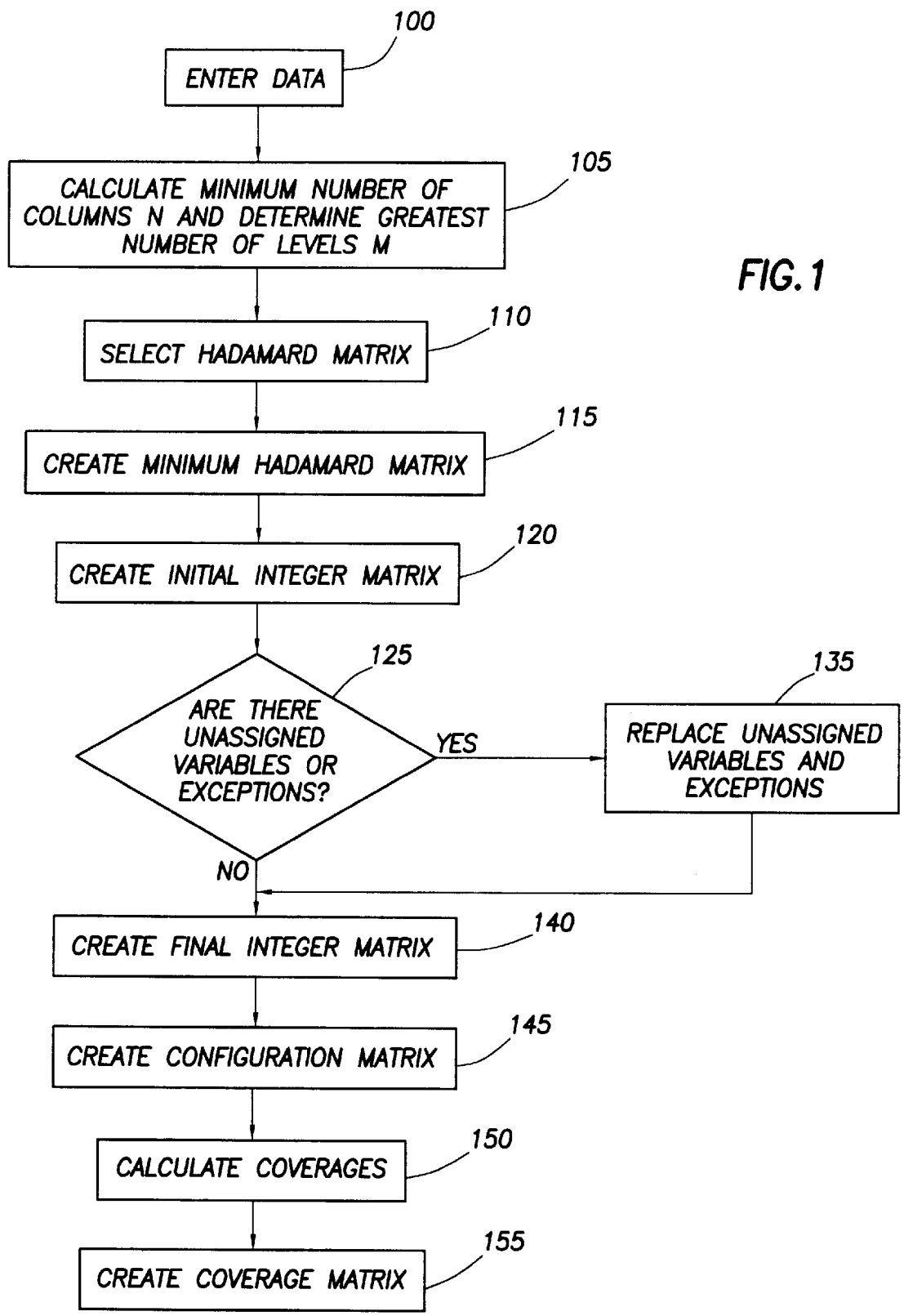
FIG. 1 is a flow chart illustrating a method for developing testing configurations according to one embodiment.

A Hadamard matrix of size $2^n$ constructed in the manner described below enables the number of columns of the matrix for which orthogonality will hold true to be increased from n+1 to $2^n-1$. The orthogonality condition will still hold true for this increased number of columns if both the Hadamard matrix is constructed in the manner described below, and if columns are selected sequentially from the matrix rather than randomly.

As indicated above, Hadamard matrices are well known and there are many different variations on these Hadamard matrices that have been developed over time. Applicants have discovered that certain Hadamard matrices will achieve the above objective of increasing the number of columns in the matrix for which the orthogonality condition will hold true. In particular, this can be achieved if the Hadamard matrix is constructed in a cyclic method using the following generator vectors:

| 4 | + | + | − | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| 8 | + | + | + | − | + | − | − | | | | | | | | | | | | | | | | | | | | | | | | |
| 16 | + | + | + | + | − | + | − | + | + | − | − | + | − | + | − | − | | | | | | | | | | | | | | | |
| 32 | + | + | + | + | + | − | − | + | + | − | + | − | − | + | − | − | − | − | + | − | + | − | | | | | | | | | |
|  | + | + | + | − | + | + | − | − | − | | | | | | | | | | | | | | | | | | | | | | |

| 64 | + | + | + | + | + | + | − | + | − | + | − | + | + | − | − | + | + | − | + | + | + | − |
|  | + | + | − | + | − | − | + | − | − | + | + | + | − | − | − | + | − | + | + | + | + | − | − |
|  | + | − | + | − | − | − | + | + | − | − | − | − | + | − | − | − | − | | | | | | |

| 128 | + | + | + | + | + | + | + | − | + | − | + | − | + | − | − | + | + | − | − | + | + | + |
|  | − | + | + | + | − | + | − | − | + | − | + | + | − | − | + | + | − | + | + | + | + | − |
|  | + | + | − | + | − | + | + | − | + | + | − | − | + | − | − | + | − | − | − | + | + | + | − |
|  | − | − | − | + | − | + | + | + | + | − | − | + | − | + | − | + | + | + | − | − | + | + |
|  | − | + | − | − | − | + | − | − | + | + | + | + | − | − | − | + | − | + | − | − | − | − | + |
|  | + | − | − | − | − | − | + | − | − | − | − | − | | | | | | | | | | | |

These generator vectors are known to successfully generate a Hadamard matrix with the properties described above, however, it is understood that other generator vectors may be found suitable as well.

To generate a Hadamard matrix in the cyclic method, we choose one of the above vectors (e.g. size 8) and first put the vector in column form as follows:

|   |
|---|
| + |
| + |
| + |
| − |
| + |
| − |
| − |

Once the vector is in column form, it is permuted as shown by shifting down one cell and moving the last one to the beginning cell as shown below.

Permutation continues to have a total of 7 columns (or (N−1), where N is the size of the associated generator vector) and results in the following matrix

| + | − | − | + | − | + | + |
|---|---|---|---|---|---|---|
| + | + | − | − | + | − | + |
| + | + | + | − | − | + | − |
| − | + | + | + | − | − | + |
| + | − | + | + | + | − | − |
| − | + | − | + | + | + | − |
| − | − | + | − | + | + | + |

Next, a row of all minus (−) signs is added to the bottom

| + | − | − | + | − | + | + |
|---|---|---|---|---|---|---|
| + | + | − | − | + | − | + |
| + | + | + | − | − | + | − |
| − | + | + | + | − | − | + |
| + | − | + | + | + | − | − |
| − | + | − | + | + | + | − |
| − | − | + | − | + | + | + |
| − | − | − | − | − | − | − | and a column of plus (+) signs is added to the left

| 0 | 1 | 2 | 3 | 4 | 5 | 6 | 7 |
|---|---|---|---|---|---|---|---|
| + | + | − | − | + | − | + | + |
| + | + | + | − | − | + | − | + |
| + | + | + | + | − | − | + | − |
| + | − | + | + | + | − | − | + |
| + | + | − | + | + | + | − | − |
| + | − | + | − | + | + | + | − |
| + | − | − | + | − | + | + | + |
| + | − | − | − | − | − | − | − |

This first column of all (+)'s, however, is disregarded in the examples below since it typically serves no useful purpose in experimental design.

That the orthogonality condition holds true for an increased number of columns if the Hadamard matrix is generated using the cyclic method and the given vectors, and if columns are selected sequentially, will now be demonstrated for Hadamard matrices of sizes 8 and 16.

The associated 8×7 Hadamard matrix generated by the cyclic method from the generator vector provided above will be

| | | | | | | | |
|---|---|---|---|---|---|---|---|
| 1 | + | - | - | + | - | + | + |
| 2 | + | + | - | - | + | - | + |
| 3 | + | + | + | - | - | + | - |
| 4 | - | + | + | + | - | - | + |
| 5 | + | - | + | + | + | - | - |
| 6 | - | + | - | + | + | + | - |
| 7 | - | - | + | - | + | + | + |
| 8 | - | - | - | - | - | - | - | which, when the +'s and −'s are replaced by 1's and 0's is

| | | | | | | | |
|---|---|---|---|---|---|---|---|
| 1 | 1 | 0 | 0 | 1 | 0 | 1 | 1 |
| 2 | 1 | 1 | 0 | 0 | 1 | 0 | 1 |
| 3 | 1 | 1 | 1 | 0 | 0 | 1 | 0 |
| 4 | 0 | 1 | 1 | 1 | 0 | 0 | 1 |
| 5 | 1 | 0 | 1 | 1 | 1 | 0 | 0 |
| 6 | 0 | 1 | 0 | 1 | 1 | 1 | 0 |
| 7 | 0 | 0 | 1 | 0 | 1 | 1 | 1 |
| 8 | 0 | 0 | 0 | 0 | 0 | 0 | 0 |

The orthogonal condition holds true for strength 3 for the above matrix if columns are sequentially selected. By way of proof, the matrix above is first examined for orthogonality of strength 2 by taking two adjacent columns and substituting the values 0, 1, 2 and 3 for the combinations 00, 01, 10, and 11 respectively. The starting column is irrelevant, but for the purpose of demonstration the columns have been selected in the following order: (1,2), (2,3), (3,4), (4,5), (5,6), (6,7) and (7, 1). The resulting table is

| | 2 Adjacent Column Replacement | | | | | | |
|---|---|---|---|---|---|---|---|
| 1 | 2 | 0 | 1 | 2 | 1 | 3 | 3 |
| 2 | 3 | 2 | 0 | 1 | 2 | 1 | 3 |
| 3 | 3 | 3 | 2 | 0 | 1 | 2 | 1 |
| 4 | 1 | 3 | 3 | 2 | 0 | 1 | 2 |
| 5 | 2 | 1 | 3 | 3 | 2 | 0 | 1 |
| 6 | 1 | 2 | 1 | 3 | 3 | 2 | 0 |
| 7 | 0 | 1 | 2 | 1 | 3 | 3 | 2 |
| 8 | 0 | 0 | 0 | 0 | 0 | 0 | 1 | which when sorted becomes

| | Sorted | | | | | | |
|---|---|---|---|---|---|---|---|
| 1 | 0 | 0 | 0 | 0 | 0 | 0 | 0 |
| 2 | 0 | 0 | 0 | 0 | 0 | 0 | 0 |
| 3 | 1 | 1 | 1 | 1 | 1 | 1 | 1 |
| 4 | 1 | 1 | 1 | 1 | 1 | 1 | 1 |
| 5 | 2 | 2 | 2 | 2 | 2 | 2 | 2 |
| 6 | 2 | 2 | 2 | 2 | 2 | 2 | 2 |
| 7 | 3 | 3 | 3 | 3 | 3 | 3 | 3 |
| 8 | 3 | 3 | 3 | 3 | 3 | 3 | 3 |

Thus, it is clear that the orthogonality condition for a Hadamard matrix generated by the cycle method holds true for strength 2 regardless of the starting column, so long as the two selected columns are sequential.

The same can be demonstrated for strength 3. First, the three adjacent columns of the original Hadamard matrix are selected, and the values 0, 1, 2, 3, 4, 5, 6 and 7 are substituted for 000, 001, 010, 011, 100, 101, 110 and 111 respectively. Once again, the starting column is irrelevant, but for purposes of demonstration the columns have been selected sequentially as follows: (1,2,3), (2,3,4), (3,4,5), (4,5,6), (5,6,7), (6,7,1) and (7,1,2). The resulting matrix is

| | 3 Adjacent Column replacement | | | | | |
|---|---|---|---|---|---|---|
| 4 | 1 | 2 | 5 | 3 | 7 | 6 |
| 6 | 4 | 1 | 2 | 5 | 3 | 7 |
| 7 | 6 | 4 | 1 | 2 | 5 | 3 |
| 3 | 7 | 6 | 4 | 1 | 2 | 5 |
| 5 | 3 | 7 | 6 | 4 | 1 | 2 |
| 2 | 5 | 3 | 7 | 6 | 4 | 1 |
| 1 | 2 | 5 | 3 | 7 | 6 | 4 |
| 0 | 0 | 0 | 0 | 0 | 0 | 0 | which when sorted becomes

| | Sorted | | | | | |
|---|---|---|---|---|---|---|
| 0 | 0 | 0 | 0 | 0 | 0 | 0 |
| 1 | 1 | 1 | 1 | 1 | 1 | 1 |
| 2 | 2 | 2 | 2 | 2 | 2 | 2 |
| 3 | 3 | 3 | 3 | 3 | 3 | 3 |
| 4 | 4 | 4 | 4 | 4 | 4 | 4 |
| 5 | 5 | 5 | 5 | 5 | 5 | 5 |
| 6 | 6 | 6 | 6 | 6 | 6 | 6 |
| 7 | 7 | 7 | 7 | 7 | 7 | 7 |

Again, it is apparent that orthogonality of strength 3 holds true for the 8×7 Hadamard matrix. In other words, for any group of three consecutive columns, there will be equal numbers of all possible variations of the three factors, and in 8 trials there will be one of each variation. Thus, orthogonality will hold true across seven factors rather than four if the matrix is constructed as described above, and if columns are selected sequentially.

Proof can also be established for n=4. Using the generator vector disclosed above, the resulting Hadamard matrix generated by the cyclic method will be:

| | | | | | | | | | | | | | | | | |
|---|---|---|---|---|---|---|---|---|---|---|---|---|---|---|---|---|
| 1 | + | + | - | - | - | + | - | - | + | + | - | + | - | + | + | + |
| 2 | + | + | + | - | - | - | + | - | - | + | + | - | + | - | + | + |
| 3 | + | + | + | + | - | - | - | + | - | - | + | + | - | + | - | + |
| 4 | + | + | + | + | + | - | - | - | + | - | - | + | + | - | + | - |
| 5 | + | - | + | + | + | + | - | - | - | + | - | - | + | + | - | + |
| 6 | + | + | - | + | + | + | + | - | - | - | + | - | - | + | + | - |
| 7 | + | - | + | - | + | + | + | + | - | - | - | + | - | - | + | + |
| 8 | + | + | - | + | - | + | + | + | + | - | - | - | + | - | - | + |
| 9 | + | + | + | - | + | - | + | + | + | + | - | - | - | + | - | - |
| 10 | + | - | + | + | - | + | - | + | + | + | + | - | - | - | + | - |
| 11 | + | - | - | + | + | - | + | - | + | + | + | + | - | - | - | + |
| 12 | + | + | - | - | + | + | - | + | - | + | + | + | + | - | - | - |
| 13 | + | - | + | - | - | + | + | - | + | - | + | + | + | + | - | - |
| 14 | + | - | - | + | - | - | + | + | - | + | - | + | + | + | + | - |
| 15 | + | - | - | - | + | - | - | + | + | - | + | - | + | + | + | + |
| 16 | + | - | - | - | - | - | - | - | - | - | - | - | - | - | - | - |

In testing for orthogonality of strength 2, taking two consecutive columns starting with (1,2) and substituting 0, 1, 2 and 3 for the values 00, 01, 10 and 11 results in the following matrix:

| Group of 2 columns at a time | | | | | | | | | | | | | | |
|---|---|---|---|---|---|---|---|---|---|---|---|---|---|---|
| 2 | 0 | 0 | 1 | 2 | 0 | 1 | 3 | 2 | 1 | 2 | 1 | 3 | 3 | 3 |
| 3 | 2 | 0 | 0 | 1 | 2 | 0 | 1 | 3 | 2 | 1 | 2 | 1 | 3 | 3 |
| 3 | 3 | 2 | 0 | 0 | 1 | 2 | 0 | 1 | 3 | 2 | 1 | 2 | 1 | 3 |
| 3 | 3 | 3 | 2 | 0 | 0 | 1 | 2 | 0 | 1 | 3 | 2 | 1 | 2 | 1 |
| 1 | 3 | 3 | 3 | 2 | 0 | 0 | 1 | 2 | 0 | 1 | 3 | 2 | 1 | 2 |
| 2 | 1 | 3 | 3 | 3 | 2 | 0 | 0 | 1 | 2 | 0 | 1 | 3 | 2 | 1 |
| 1 | 2 | 1 | 3 | 3 | 3 | 2 | 0 | 0 | 1 | 2 | 0 | 1 | 3 | 2 |
| 2 | 1 | 2 | 1 | 3 | 3 | 3 | 2 | 0 | 0 | 1 | 2 | 0 | 1 | 3 |
| 3 | 2 | 1 | 2 | 1 | 3 | 3 | 3 | 2 | 0 | 0 | 1 | 2 | 0 | 1 |
| 1 | 3 | 2 | 1 | 2 | 1 | 3 | 3 | 3 | 2 | 0 | 0 | 1 | 2 | 0 |
| 0 | 1 | 3 | 2 | 1 | 2 | 1 | 3 | 3 | 3 | 2 | 0 | 0 | 1 | 2 |
| 2 | 0 | 1 | 3 | 2 | 1 | 2 | 1 | 3 | 3 | 3 | 2 | 0 | 0 | 1 |
| 1 | 2 | 0 | 1 | 3 | 2 | 1 | 2 | 1 | 3 | 3 | 3 | 2 | 0 | 0 |
| 0 | 1 | 2 | 0 | 1 | 3 | 2 | 1 | 2 | 1 | 3 | 3 | 3 | 2 | 0 |
| 0 | 0 | 1 | 2 | 0 | 1 | 3 | 2 | 1 | 2 | 1 | 3 | 3 | 3 | 2 |
| 0 | 0 | 0 | 0 | 0 | 0 | 0 | 0 | 0 | 0 | 0 | 0 | 0 | 0 | 0 | which, when sorted, becomes

| Sorted | | | | | | | | | | | | | | |
|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 |
| 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 |
| 3 | 3 | 3 | 3 | 3 | 3 | 3 | 3 | 3 | 3 | 3 | 3 | 3 | 3 | 3 |
| 3 | 3 | 3 | 3 | 3 | 3 | 3 | 3 | 3 | 3 | 3 | 3 | 3 | 3 | 3 |
| 3 | 3 | 3 | 3 | 3 | 3 | 3 | 3 | 3 | 3 | 3 | 3 | 3 | 3 | 3 |
| 3 | 3 | 3 | 3 | 3 | 3 | 3 | 3 | 3 | 3 | 3 | 3 | 3 | 3 | 3 |

Again, as can be seen, the orthogonality condition holds true for strength 2.

For strength 3, substituting in the same manner as above results in the following matrix:

| Group of 3 columns at a time | | | | | | | | | | | | | | |
|---|---|---|---|---|---|---|---|---|---|---|---|---|---|---|
| 4 | 0 | 1 | 2 | 4 | 1 | 3 | 6 | 5 | 2 | 5 | 3 | 7 | 7 | 6 |
| 6 | 4 | 0 | 1 | 2 | 4 | 1 | 3 | 6 | 5 | 2 | 5 | 3 | 7 | 7 |
| 7 | 6 | 4 | 0 | 1 | 2 | 4 | 1 | 3 | 6 | 5 | 2 | 5 | 3 | 7 |
| 7 | 7 | 6 | 4 | 0 | 1 | 2 | 4 | 1 | 3 | 6 | 5 | 2 | 5 | 3 |
| 3 | 7 | 7 | 6 | 4 | 0 | 1 | 2 | 4 | 1 | 3 | 6 | 5 | 2 | 5 |
| 5 | 3 | 7 | 7 | 6 | 4 | 0 | 1 | 2 | 4 | 1 | 3 | 6 | 5 | 2 |
| 2 | 5 | 3 | 7 | 7 | 6 | 4 | 0 | 1 | 2 | 4 | 1 | 3 | 6 | 5 |
| 5 | 2 | 5 | 3 | 7 | 7 | 6 | 4 | 0 | 1 | 2 | 4 | 1 | 3 | 6 |
| 6 | 5 | 2 | 5 | 3 | 7 | 7 | 6 | 4 | 0 | 1 | 2 | 4 | 1 | 3 |
| 3 | 6 | 5 | 2 | 5 | 3 | 7 | 7 | 6 | 4 | 0 | 1 | 2 | 4 | 1 |
| 1 | 3 | 6 | 5 | 2 | 5 | 3 | 7 | 7 | 6 | 4 | 0 | 1 | 2 | 4 |
| 4 | 1 | 3 | 6 | 5 | 2 | 5 | 3 | 7 | 7 | 6 | 4 | 0 | 1 | 2 |
| 2 | 4 | 1 | 3 | 6 | 5 | 2 | 5 | 3 | 7 | 7 | 6 | 4 | 0 | 1 |
| 1 | 2 | 4 | 1 | 3 | 6 | 5 | 2 | 5 | 3 | 7 | 7 | 6 | 4 | 0 |
| 0 | 1 | 2 | 4 | 1 | 3 | 6 | 5 | 2 | 5 | 3 | 7 | 7 | 6 | 4 |
| 0 | 0 | 0 | 0 | 0 | 0 | 0 | 0 | 0 | 0 | 0 | 0 | 0 | 0 | 0 |

Which, when sorted, becomes

| | | | | | | | | | | | | | | |
|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 |
| 2 | 2 | 2 | 2 | 2 | 2 | 2 | 2 | 2 | 2 | 2 | 2 | 2 | 2 | 2 |
| 2 | 2 | 2 | 2 | 2 | 2 | 2 | 2 | 2 | 2 | 2 | 2 | 2 | 2 | 2 |
| 3 | 3 | 3 | 3 | 3 | 3 | 3 | 3 | 3 | 3 | 3 | 3 | 3 | 3 | 3 |
| 3 | 3 | 3 | 3 | 3 | 3 | 3 | 3 | 3 | 3 | 3 | 3 | 3 | 3 | 3 |
| 4 | 4 | 4 | 4 | 4 | 4 | 4 | 4 | 4 | 4 | 4 | 4 | 4 | 4 | 4 |
| 4 | 4 | 4 | 4 | 4 | 4 | 4 | 4 | 4 | 4 | 4 | 4 | 4 | 4 | 4 |
| 5 | 5 | 5 | 5 | 5 | 5 | 5 | 5 | 5 | 5 | 5 | 5 | 5 | 5 | 5 |
| 5 | 5 | 5 | 5 | 5 | 5 | 5 | 5 | 5 | 5 | 5 | 5 | 5 | 5 | 5 |
| 6 | 6 | 6 | 6 | 6 | 6 | 6 | 6 | 6 | 6 | 6 | 6 | 6 | 6 | 6 |
| 6 | 6 | 6 | 6 | 6 | 6 | 6 | 6 | 6 | 6 | 6 | 6 | 6 | 6 | 6 |
| 7 | 7 | 7 | 7 | 7 | 7 | 7 | 7 | 7 | 7 | 7 | 7 | 7 | 7 | 7 |
| 7 | 7 | 7 | 7 | 7 | 7 | 7 | 7 | 7 | 7 | 7 | 7 | 7 | 7 | 7 | clearly showing orthogonality for strength 3.

Finally, orthogonality also holds true for strength 4. By selecting 4 columns sequentially, and substituting 0 through 15 for the binary values 0000 through 1111 respectively results in the following matrix:

| Group of 4 columns at a time |
|---|
| 8 | 1 | 2 | 4 | 9 | 3 | 6 | 13 | 10 | 5 | 11 | 7 | 15 | 14 | 12 |
|---|---|---|---|---|---|---|---|---|---|---|---|---|---|---|
| 12 | 8 | 1 | 2 | 4 | 9 | 3 | 6 | 13 | 10 | 5 | 11 | 7 | 15 | 14 |
| 14 | 12 | 8 | 1 | 2 | 4 | 9 | 3 | 6 | 13 | 10 | 5 | 11 | 7 | 15 |
| 15 | 14 | 12 | 8 | 1 | 2 | 4 | 9 | 3 | 6 | 13 | 10 | 5 | 11 | 7 |
| 7 | 15 | 14 | 12 | 8 | 1 | 2 | 4 | 9 | 3 | 6 | 13 | 10 | 5 | 11 |
| 11 | 7 | 15 | 14 | 12 | 8 | 1 | 2 | 4 | 9 | 3 | 6 | 13 | 10 | 5 |
| 5 | 11 | 7 | 15 | 14 | 12 | 8 | 1 | 2 | 4 | 9 | 3 | 6 | 13 | 10 |
| 10 | 5 | 11 | 7 | 15 | 14 | 12 | 8 | 1 | 2 | 4 | 9 | 3 | 6 | 13 |
| 13 | 10 | 5 | 11 | 7 | 15 | 14 | 12 | 8 | 1 | 2 | 4 | 9 | 3 | 6 |
| 6 | 13 | 10 | 5 | 11 | 7 | 15 | 14 | 12 | 8 | 1 | 2 | 4 | 9 | 3 |
| 3 | 6 | 13 | 10 | 5 | 11 | 7 | 15 | 14 | 12 | 8 | 1 | 2 | 4 | 9 |
| 9 | 3 | 6 | 13 | 10 | 5 | 11 | 7 | 15 | 14 | 12 | 8 | 1 | 2 | 4 |
| 4 | 9 | 3 | 6 | 13 | 10 | 5 | 11 | 7 | 15 | 14 | 12 | 8 | 1 | 2 |
| 2 | 4 | 9 | 3 | 6 | 13 | 10 | 5 | 11 | 7 | 15 | 14 | 12 | 8 | 1 |
| 1 | 2 | 4 | 9 | 3 | 6 | 13 | 10 | 5 | 11 | 7 | 15 | 14 | 12 | 8 |
| 0 | 0 | 0 | 0 | 0 | 0 | 0 | 0 | 0 | 0 | 0 | 0 | 0 | 0 | 0 | which, when sorted, becomes

| Sorted |
|---|
| 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|
| 1 | 1 | 1 | 1 | 1 | 1 | 1 | 1 | 1 | 1 | 1 | 1 | 1 | 1 | 1 |
| 2 | 2 | 2 | 2 | 2 | 2 | 2 | 2 | 2 | 2 | 2 | 2 | 2 | 2 | 2 |
| 3 | 3 | 3 | 3 | 3 | 3 | 3 | 3 | 3 | 3 | 3 | 3 | 3 | 3 | 3 |
| 4 | 4 | 4 | 4 | 4 | 4 | 4 | 4 | 4 | 4 | 4 | 4 | 4 | 4 | 4 |
| 5 | 5 | 5 | 5 | 5 | 5 | 5 | 5 | 5 | 5 | 5 | 5 | 5 | 5 | 5 |
| 6 | 6 | 6 | 6 | 6 | 6 | 6 | 6 | 6 | 6 | 6 | 6 | 6 | 6 | 6 |
| 7 | 7 | 7 | 7 | 7 | 7 | 7 | 7 | 7 | 7 | 7 | 7 | 7 | 7 | 7 |
| 8 | 8 | 8 | 8 | 8 | 8 | 8 | 8 | 8 | 8 | 8 | 8 | 8 | 8 | 8 |
| 9 | 9 | 9 | 9 | 9 | 9 | 9 | 9 | 9 | 9 | 9 | 9 | 9 | 9 | 9 |
| 10 | 10 | 10 | 10 | 10 | 10 | 10 | 10 | 10 | 10 | 10 | 10 | 10 | 10 | 10 |
| 11 | 11 | 11 | 11 | 11 | 11 | 11 | 11 | 11 | 11 | 11 | 11 | 11 | 11 | 11 |
| 12 | 12 | 12 | 12 | 12 | 12 | 12 | 12 | 12 | 12 | 12 | 12 | 12 | 12 | 12 |
| 13 | 13 | 13 | 13 | 13 | 13 | 13 | 13 | 13 | 13 | 13 | 13 | 13 | 13 | 13 |
| 14 | 14 | 14 | 14 | 14 | 14 | 14 | 14 | 14 | 14 | 14 | 14 | 14 | 14 | 14 |
| 15 | 15 | 15 | 15 | 15 | 15 | 15 | 15 | 15 | 15 | 15 | 15 | 15 | 15 | 15 |

Again, in each column there are equal number of variables 0–5.

In sum, the above proof demonstrates that for a Hadamard matrix of size $2^n$ generated by the cyclic method using the specified generator vectors, for n=2, 3, 4, . . . the orthogonality condition for strength 2, 3, . . . n, holds true for ($2^n$1) columns if the columns are selected sequentially from the Hadamard matrix. Thus, orthogonality can be maintained across a larger number of factors in the same number of trials, improving results for a given number of trials and improving coverage as well.

The system and method described below further applies this discovery to create a software program, referred to as a configuration generator tool (CGT), for creating configuration tables or matrices for compatibility testing. Additional features of the program, also described below, further improve coverage and thus, improve the reliability and efficiency of the configuration testing. Further, the configuration generator tool provides useful information to a user regarding coverage, enabling a user to make informed decisions as to the number of trials to be run and the configurations of those trials. Exception handling is also provided, enabling specified combinations to be excluded from the final configurations.

In one embodiment, the configuration generator tool is a Windows based program, however, any other software interface may also be used. The CGT may be run on any typical computer system. Referring now to FIG. 1, to use the configuration generator tool a user must first enter, by means of any input device such as a keyboard, appropriate information such as the different factors to be tested and the levels for each factor at step 100. Once this information has been entered, the minimum number of required columns N is calculated at step 105.

Calculation of the minimum number of columns N requires an assessment of the number of factors involved, and the number of levels for each factor so as to be able to determine the number of columns needed for each factor. For example, if a factor has two levels, one column is sufficient for this factor since both levels can be represented by a "1" or a "0." If a factor has three or four levels, two columns are needed since the levels must be represented by 11, 01, 10 and 11 (if needed). The sum of the number of columns needed for each factor represents the minimum number of columns needed N. Finally, the greatest number of levels (M) for any given factor is also determined at step 105.

The next step 110 is to select a Hadamard matrix of an appropriate size from a list of Hadamard matrices. Each Hadamard matrix on the list is preferably generated by the cyclic method using generator vectors such as those provided above so as to result in a matrix having the properties described above. In one embodiment, the configuration generator tool includes Hadamard matrices of sizes 4, 8, 16, 32, 64, and 128, however other sizes may also be used.

In one embodiment, the size of the Hadamard matrix is selected first by choosing the larger of the total number of columns needed (N) and a power of 2 which is greater than the maximum number of levels (M) determined previously. For example, if the maximum number of columns is 8 (N=8) and M=9, then a power of two greater than 9 is 16. Since 16 is larger than 8, a Hadamard matrix of size 16 will be selected. Following selection of the Hadamard matrix, a minimum Hadamard matrix is created at step 115 by selecting from the selected Hadamard matrix the minimum number of columns needed N. Thus, the number of columns of the selected Hadamard matrix is reduced to the minimum number of columns as determined above.

Next, at step 120 an initial integer matrix (IIM) is created from the minimum Hadamard matrix. As described above for factors having more than two levels, the appropriate number of consecutive columns of the minimum Hadamard matrix must be combined to populate the table. For example, if the minimum Hadamard matrix is as follows

|   | 1 | 2 | 3 |
|---|---|---|---|
| 1 | 1 | 0 | 0 |
| 2 | 1 | 1 | 0 |
| 3 | 1 | 1 | 1 |
| 4 | 0 | 1 | 1 |
| 5 | 1 | 0 | 1 |
| 6 | 0 | 1 | 0 |
| 7 | 0 | 0 | 1 |
| 8 | 0 | 0 | 0 | and there are two factors, with four levels for the first factor (level 1=00; level 2=01; level 3=10; and level 4=00 and two levels for the second factor (level 1=0, level 2=1), then the first two columns would be combined for the first factor and the third column would represent the second factor. Next, each level of a given factor is assigned a "level index," which preferably is an integer value from 1 to the maximum number of levels for that factor. Further, each level index is assigned a different binary code. For each consecutive factor, the columns of the Hadamard matrix are populated by referring to the corresponding column or columns of the Hadamard matrix for that factor, and inserting in the initial integer matrix the level index corresponding to the binary code appearing in the Hadamard matrix. For the above example, this results in the following initial integer matrix

|   | F1 | F2 |
|---|----|----|
| 1 | 3  | 1  |
| 2 | 4  | 1  |
| 3 | 4  | 2  |
| 4 | 2  | 2  |
| 5 | 3  | 2  |
| 6 | 2  | 1  |
| 7 | 1  | 2  |
| 8 | 1  | 1  |

In the above example, the number of levels for each factor is a power of two, and thus, there are no unassigned variables. In other words, there are no binary codes appearing in the Hadamard matrix that have not been assigned a level index. In the event that there are unassigned variables, such as factor 1 having three levels, leaving 11 unassigned, the configuration generator tool accounts for such cases in a manner that optimizes coverage. If certain variables or binary codes are unassigned for a given factor, when generating the initial integer matrix the configuration generator tool will leave an indicator, such as a blank, in the integer matrix where the unassigned variable would otherwise appear.

At step 125, the CGT will first determine if there are any unassigned variables (blanks) in the initial integer table. At this step it will also determine whether any exceptions are present in the initial integer table. Exceptions are particular "level combinations" (a particular combination of level indexes appearing across a given row) that the user has specified should not appear for testing. Exceptions will be previously entered by the user, such as at the time factor and level data is entered at step 100. If either blanks or exceptions appear in the initial integer table, the configuration generator tool will, in the manner described in more detail below, specify certain assigned level indexes to fill in the blanks (or specify level combinations to replace those having blanks), and/or assign specific level combinations to replace exceptions at step 135. If no exceptions or blanks are found the initial integer matrix will become the final integer matrix at step 140.

Figure 2:
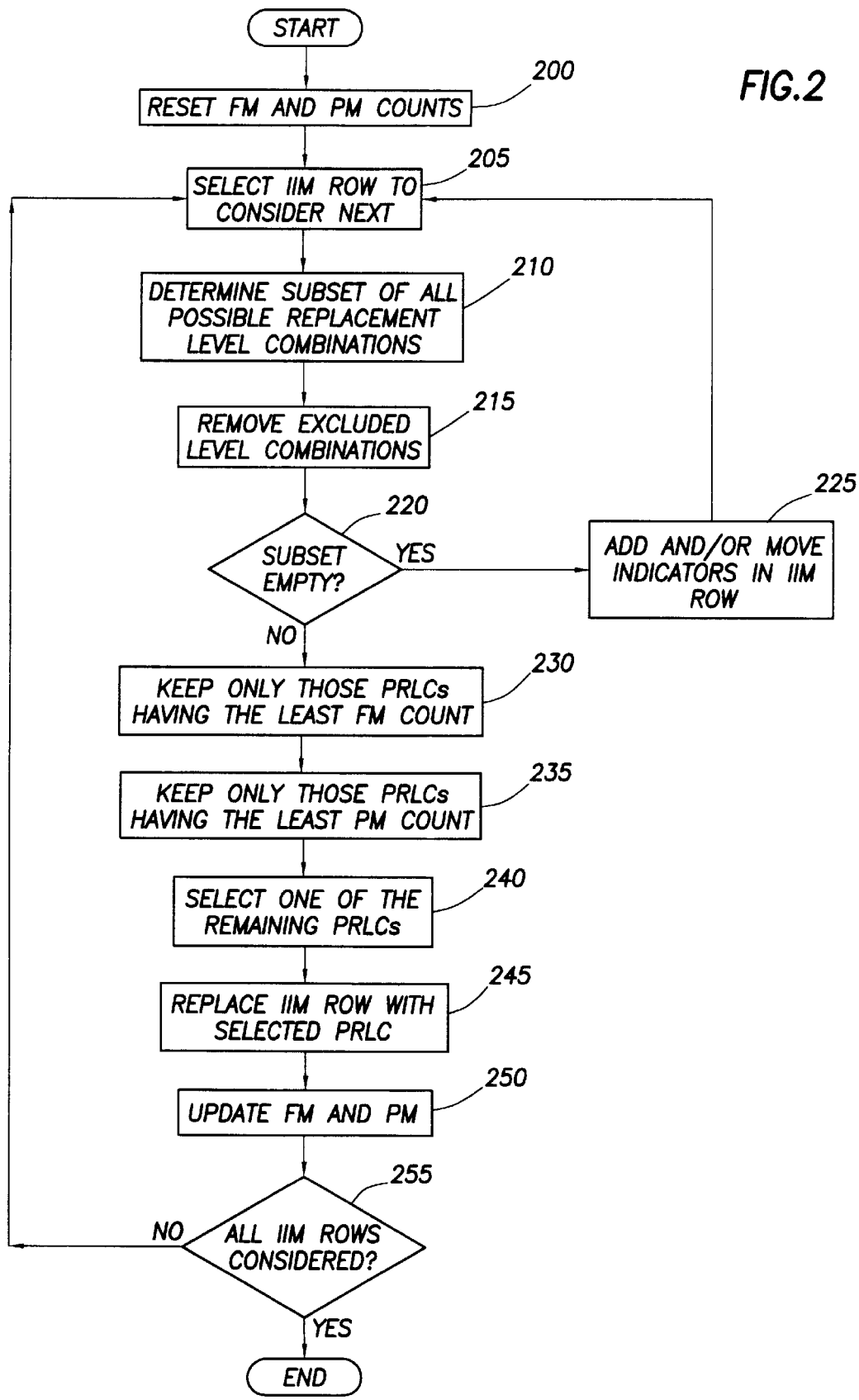
FIG. 2 is a flow chart illustrating one method for replacing unassigned variables and removing exceptions from an integer matrix.

One system and method for replacing unassigned variables and exceptions (step 135) will now be described in detail. The steps involved will be described with reference to the flow chart of FIG. 2. Although computer code illustrating one specific implementation is attached as Appendix A, it is to be understood that one skilled in the art will recognize that there are many different ways to implement in a computer program the system and method illustrated by FIG. 2.

To assign unassigned variables in a manner that maximizes coverage, in one embodiment the configuration generator tool uses two tools; a proportionality matrix (PM) and a frequency matrix (FM). The proportionality matrix is a two-dimensional matrix having a number of columns equal to the number of factors, and the number of rows equal to the maximum number of levels for any given factor. Therefore, the proportionality matrix is "uneven" in the rows since some factors will have more levels than others. The cells of the proportionality matrix also contain counts that are also initially set to zero, and are incremented in accordance with entries made to the initial integer matrix. The proportionality matrix count, referred to below, is the sum of the counts corresponding to each level in a given level combination. In other words, for such a given level combination the proportionality matrix count is determined by traversing the columns of the level combination (i.e. each consecutive factor) and adding the count appearing in the corresponding cell (for that factor and level combination) of the proportionality matrix to a running sum. When a level combination is entered in the initial integer matrix, the proportionality matrix is updated by incrementing each of the cells (one for each factor) corresponding to the levels appearing as elements in the level combination.

Conceptually, the frequency matrix is a multi-dimensional matrix, the dimensions of which correspond to each factor. In particular, each dimension of the frequency matrix consists of the levels for the factor. Therefore, the cells of the frequency matrix represent counts (referred to as the frequency matrix count) and, in particular, the number of times (i.e., the frequency) that a level combination has been entered into the initial integer matrix. The frequency matrix is updated each time a level combination is selected (entered) in the initial integer matrix, as will be more fully described below. The frequency matrix is actually a sparse matrix, and can be implemented as a list, or in any other suitable manner, as will be apparent to one skilled in the art With reference to FIG. 2, the first step (step 200) in replacing unassigned variables is to reset the proportionality and frequency matrix counts. Next, at step 205, the configuration generator tool will select a row of the initial integer matrix (IIM) for consideration. Rows may be considered in any manner, such as from top to bottom. In one embodiment, the rows selected for consideration first are those having the least number of indicators. At step 210, the CGT determines the subset of all possible replacement level combinations (PRLCs). Possible replacement level combinations are those having the same assigned level indexes for the same given factors, and having any possible level index that could be used to fill in the level combination vector element having an indicator present. At step 215, the CGT will examine the subset of possible replacement level combinations and remove those that are excluded. This step, of course, need not be performed if no exclusions will be designated. The CGT will then, at step 220, determine whether the subset of possible replacement level combinations is empty. If so, at step 225 the CGT will either replace one or more assigned level indexes with indicators, or move an indicator to a different location that originally had an assigned level index. This can be done in any defined manner, or may be done arbitrarily. One such method for adding/moving indicators is disclosed in the computer code attached hereto as Appendix A. Once step 225 is complete, the CGT will return to step 205.

If, at step 220, the CGT determines that the subset is not empty, it will examine the frequency matrix count for each possible replacement level combination in the subset, and keep or retain only those having the lowest frequency matrix count at step 230. Since the frequency matrix provides data representing the number of times level combinations have appeared in the initial integer matrix, selecting the level combination having the lowest frequency matrix count ensures that the level combinations that have appeared the least number of times will be selected as the replacement. This, in turn, ensures that coverage will be maximized.

If, however, there are more than one possible replacement level combinations having the same lowest frequency matrix count, the proportionality matrix is consulted to select the possible replacement level combination that will best maximize coverage. The proportionality matrix count is examined for each of the selected possible replacement level combinations. At step 235, the CGT will select and keep only those possible replacement level combinations having the lowest proportionality matrix. If multiple possible replacement level combinations have the same lowest proportionality matrix count, then at step 240 one of these possible replacement level combinations is chosen. This may be done arbitrarily or according to any predetermined algorithm. Subsequently, the possible replacement level combination chosen by consulting the frequency matrix, and possibly the proportionality matrix, is placed in the initial integer matrix at step 245 to replace the level combination in which the indicator originally appeared. The frequency and proportionality matrices are then updated at step 250 to reflect these changes.

At step 255, the CGT determines whether all rows of the initial integer matrix have been considered. If not, it will return to step 205 and select another row to consider. If all rows have been considered, the initial integer matrix will become the final integer matrix (see step 140 in FIG. 1). At this point, all indicators in the integer matrix have been filled, and all exceptions have been removed from the integer matrix.

Referring back to FIG. 1, a configuration matrix is then created from the final integer matrix at step 145. In the configuration matrix, level indexes may be replaced by descriptors that preferably provide additional information to the user so that the user can readily view the matrix to determine the combinations of levels for each trial or test. In the alternative, descriptors may be the same integer values, with the column headings being such that they convey the additional information to the user. For example, in the above final integer matrix if factor 1 is a CPU and factor 2 is memory, the configuration matrix may be:

|   | CPU | Memory |
|---|-----|--------|
| 1 | CPU3 | MEM1 |
| 2 | CPU4 | MEM1 |
| 3 | CPU4 | MEM2 |
| 4 | CPU2 | MEM2 |
| 5 | CPU3 | MEM2 |
| 6 | CPU2 | MEM1 |

-continued

|   | CPU | Memory |
|---|-----|--------|
| 7 | CPU1 | MEM2 |
| 8 | CPU1 | MEM1 |

From the constructed matrices, configuration coverages will be calculated at step 150, and a coverage matrix created at step 155. Configuration coverages may be calculated by either the exact or approximate methods, as selected by the user. For the exact method, all possible combinations of factors and levels are calculated and stored in tables. The configuration matrix is compared against this table to determine whether each of the possible levels for each factor appears, whether each possible combination of levels for each two factors appear, and so on. The results are available to the user in the form of a coverage table or coverage matrix such as the following in which for a given number of runs or trials the coverages for single factors, combinations of two factors, and so on are displayed.

|    | Single Factor | Group of 2 Factors | Group of 3 Factors |
|----|---------------|--------------------|--------------------|
| 4  | 100 | 100 | 52.8 |
| 8  | 100 | 100 | 100 |
| 16 | 100 | 100 | 100 |
| 32 | 100 | 100 | 100 |

In this example, the above matrix informs the user that if only four trials are performed there will be only 52.8% coverage for combinations of three factors. Thus, a user can use the information provided by the configuration generator tool to make informed decisions as to the minimum number of trials that must be run and the coverages that can be achieved.

Calculation of coverages according to the approximate method uses a random number generator. For example, for combinations of two factors, two factors are selected randomly then the configuration matrix is searched to determine if that combination is present. If so, a hit is registered, otherwise a miss is registered. This process is repeated a preselected number of times, such as 1000, for each number of combinations (i.e. for combinations of two, then combinations of three, and so on). Coverage results are displayed in the same manner as described above. The approximate method is beneficial when the number of possible configurations is very large, where calculations of combinations can be very time consuming. Results are displayed in a coverage matrix in a similar manner as described above.

"APPENDIX A"

```
bool CConfigurationInstance::Com    eIntegerMatrix()
{
    ASSERT(m_pHadamardMatrix);
    ASSERT(m_pIntegerMatrix);
    ASSERT(m_pOriginalIntegerMatrix);

// release previous frequency matrix memory
    for (int i = 0; i < m_FrequencyMatrixCells.GetSize(); i++)
        delete m_FrequencyMatrixCells[i];
    m_FrequencyMatrixCells.RemoveAll();

const CFactorArray& rFactors = m_pDoc->GetFactors();
    int nIMLength = m_nNbrRows * m_nNbrFactors;
    const int* const pRVEnd = m_pRowVector + m_nNbrFactors;
    const int* const pIVEnd = m_pIndexVector + m_nNbrFactors;
    const int* const pIMCol0End = m_pIntegerMatrix + nIMLength;

// reset factor prop matrix ------------------------------------------ int* pPM = m_pProportionalityMatrix;
    const int* const pPMEnd = m_pProportionalityMatrix +
        (m_nNbrFactors * m_nMaxNbrLevels);
    while (pPM < pPMEnd)
        *pPM++ = 0;

int nMinPossiblePMCount = 0;

// copy the integer matrix (i.e., the one with holes - if any)

int* pIMRow = m_pIntegerMatrix;
    int* pOIMRow = m_pOriginalIntegerMatrix;
    for (;
        pIMRow < pIMCol0End;
            pIMRow += m_nNbrFactors, pOIMRow += m_nNbrFactors)
    {
        const int* const pIMRowEnd = pIMRow + m_nNbrFactors;
        int* pIM = pIMRow;
        int* pOIM = pOIMRow;
        while (pIM < pIMRowEnd)
            *pIM++ = *pOIM++;
    }

// start from the most constrained first ----------------------------- for (int nMaxBlanks = 0; nMaxBlanks <= m_nNbrFactors; nMaxBlanks++)
    {
        // traverse down the integer matrix pIMRow = m_pIntegerMatrix;
        pOIMRow = m_pOriginalIntegerMatrix;
        for (;
            pIMRow < pIMCol0End;
                pIMRow += m_nNbrFactors, pOIMRow += m_nNbrFactors)
        {
            const int* const pIMRowEnd = pIMRow + m_nNbrFactors;

// compute nbr blanks in this IM row

START:
```

1

```
int nBlankCount = Cor    eNbrBlanksInIMRow(pIMRow,pIMRc    );

if (nBlankCount == nMaxBlanks)
{
    int* pRV = NULL;
    int nSaveFMCIdx = -1;

int nMinFMCount = INT_MAX;
    int nMinPMCount = INT_MAX;

// set index vector (level combination)
    int* pIV = m_pIndexVector;
    int* pIM = pIMRow;
    for (; pIV < pIVEnd; pIV++, pIM++)
        *pIV = (*pIM == BLANK_IM_CELL) ? 0 : *pIM;

// search through reduced set of level combinations
    unsigned int nIters = 0;
    for (;;)
    {
        // check if computation thread was aborted ---------------- if (ThreadStopped())
            return false;

// check if level combination is not excluded
        if (!m_pDoc->IsLevelCombinationExcluded(m_pIndexVector,
            pIVEnd))
        {
            // check if max number of iterations was reached ------- if ((++nIters > kMaxCompleteIntegerMatrixIterations) &&
                (pRV != NULL))
                break;

// scan frequency matrix for this level combination
            int nFMCIdx = -1;
            for (int i = 0;
                i < m_FrequencyMatrixCells.GetSize();
                    i++)
                if (m_FrequencyMatrixCells[i]->IsEqual(
                    m_pIndexVector,pIVEnd))
                {
                    nFMCIdx = i;
                    break;
                } int nFMCount = (nFMCIdx == -1) ?
                0 : m_FrequencyMatrixCells[nFMCIdx]->m_nCount;

if (nFMCount < nMinFMCount)
            {
                nMinFMCount = nFMCount;
                nMinPMCount = INT_MAX;
            } if (nFMCount == nMinFMCount)
            {
                int nPMCount = ComputePMUseCount();
```

```
                if (nPMCount < nMinPMCount)
                {
                    nMinPMCount = nPMCount;

pRV = m_pRowVector;
                    pIV = m_pIndexVector;
                    while (pIV < pIVEnd)
                        *pRV++ = *pIV++;

nSaveFMCIdx = nFMCIdx;

// if both counts are at minimum,
                    // can't do any better
                    if ((nMinFMCount == 0) &&
                        (nMinPMCount == nMinPossiblePMCount))
                        break;
                }
            }
        }

// update index vector
        pIV = m_pIndexVector + m_nNbrFactors - 1;
        pIM = pIMRow + m_nNbrFactors - 1;
        for (int k = m_nNbrFactors - 1; k >= 0; k--, pIV--, pIM--)
            if (*pIM == BLANK_IM_CELL)
                if (++(*pIV) >= rFactors[k]->GetNbrLevels())
                    *pIV = 0;
                else
                    break;
        if (k < 0)
            break;
    }

// check to see if any level combination worked
    // if none did (i.e., pRV is NULL), then permute IM row if (pRV == NULL)
    {
        pIM = pIMRow + m_nNbrFactors - 1;
        const int* pOIM = pOIMRow + m_nNbrFactors - 1;
        const int* const pIMStop = pIMRow - 1;
        for (; pIM >= pIMStop; pIM--, pOIM--)
            if ((pIM == pIMStop) ||
                ((*pOIM != BLANK_IM_CELL) &&
                 (*pIM == BLANK_IM_CELL)))
            {
                int* pIM2 = pIM + 1;
                const int* pOIM2 = pOIM + 1;
                for (; pIM2 < pIMRowEnd; pIM2++, pOIM2++)
                    if (*pOIM2 != BLANK_IM_CELL)
                        break;
                if ((pIM2 < pIMRowEnd) && (*pIM2 != BLANK_IM_CELL))
                {
                    if (pIM != pIMStop)
                        *pIM = *pOIM;

for (;;)
                    {
                        ASSERT((pIM2>=pIMRow)&&(pIM2<pIMRowEnd));
                        *pIM2 = BLANK_IM_CELL;
```

```
                            pIM2++;
                            pOIM2++;
                            if (pIM2 == pIMRowEnd)
                                break;

int* pIM3 = pIM2 + 1;
                            const int* pOIM3 = pOIM2 + 1;
                            for (; pIM3 < pIMRowEnd; pIM3++, pOIM3++)
                                if ((*pOIM3 != BLANK_IM_CELL) &&
                                    (*pIM3 == BLANK_IM_CELL))
                                {
                                    *pIM3 = *pOIM3;
                                    break;
                                }
                            if (pIM3 == pIMRowEnd)
                                break;
                        } break;
                    }
                } goto START;
    }

// update frequency matrix count ------------------------------- if (nSaveFMCIdx == -1)
    {
        CFrequencyMatrixCell* pFMC = NULL;
        TRY
        {
            pFMC = new CFrequencyMatrixCell(
                m_nNbrFactors,m_pRowVector);
        }
        END_TRY
        if (pFMC == NULL)
        {
            SetComputationStatus(kCS_Error);
            return false;
        }
        m_FrequencyMatrixCells.SetAtGrow(
            m_FrequencyMatrixCells.GetSize(),pFMC);
    }
    else
        m_FrequencyMatrixCells[nSaveFMCIdx]->m_nCount++;

// update integer matrix row ------------------------------- pIM = pIMRow;
    pRV = m_pRowVector;
    while (pIM < pIMRowEnd)
        *pIM++ = *pRV++;

// update proportionality matrix ------------------------------- pIM = pIMRow;
    int* pPMCol = m_pProportionalityMatrix;
    for (; pIM < pIMRowEnd; pIM++, pPMCol++)
```

```
                    (*(pPMCol + (*    * m_nNbrFactors)))++;

// compute new min possible ------------------------------------ nMinPossiblePMCount = ComputeMinPossiblePMCount(rFactors);
        }
      }
    } return true;
}
```

What is claimed is:

1. A method for creating a testing configuration matrix comprising the steps of:

identifying factors to be tested and levels for each factor;

selecting a Hadamard matrix such that for any integer 1, 2 ... n, said Hadamard matrix has a size $2^n$ and at least $(2^n-1)$ columns, and maintains orthogonality of at least strength n when columns are selected sequentially; and creating a testing configuration matrix from said selected Hadamard matrix;

wherein said creating step comprises the steps of first creating an integer matrix from said Hadamard matrix by assigning different columns of said Hadamard matrix to represent different factors, wherein for factors having more than two levels a number X of consecutive columns of said Hadamard matrix are assigned to said factors such that X is the smallest integer for which ($2^X \geq$ the number of levels) for that factor; for each factor, assigning a level index to each level and assigning a different binary code to each level index; and inserting in the corresponding column and row of said integer matrix said level index assigned to said binary codes appearing in said Hadamard matrix;

wherein said creating step further comprises the step of inserting an indicator in said integer matrix for each binary code appearing in said Hadamard matrix that is not assigned to a level index.

2. The method according to claim 1, wherein said integer matrix is an initial integer matrix, and wherein said creating step further comprises the step of replacing indicators in said initial integer matrix with assigned level indexes for the corresponding factor, wherein said initial integer becomes a final integer matrix when all such indicators have been replaced.

3. The method according to claim 2, wherein said replacing step further comprises the steps of, for each row of said initial integer matrix having an indicator, replacing said row having said indicator with a possible replacement level combination in a manner that improves testing coverage.

4. The method according to claim 3, wherein said step of replacing in a manner that improves coverage further comprises the step of determining a subset of all possible replacement level combinations for said row containing said at least one indicator.

5. The method according to claim 4, wherein said step of replacing in a manner that improves coverage further comprises the steps of:

obtaining a frequency matrix count for each possible replacement level combination; and selecting from said subset each possible replacement level combination having a lowest frequency matrix count.

6. The method according to claim 5, wherein if more than one possible replacement level combination is selected, then said step of replacing in a manner that improves coverage further comprises the steps of obtaining a proportionality matrix count for each selected possible replacement level combination; and choosing from said subset each possible replacement level combination having a lowest proportionality matrix count.

7. The method according to claim 6, wherein if more than one possible replacement level combination is chosen, said choosing step further comprises the step of choosing a single one of said chosen possible replacement level combinations.

8. The method according to claim 7, wherein said step of replacing in a manner that improves coverage further comprises the step of replacing said row of said initial integer matrix with said selected or chosen possible replacement level combination.

9. The method according to claim 8, further comprising the step of updating said frequency and proportionality matrices.

10. The method according to claim 9, said method for developing testing configurations further comprising the steps of:

calculating coverages based on said final integer matrix; and creating a coverage matrix containing said calculated coverages.

11. The method according to claim 10, wherein said step of replacing in a manner that improves coverage further comprises the steps of, after said step of determining said subset, removing all excluded level combinations from said subset of possible replacement level combinations, and determining if said subset is empty.

12. The method according to claim 11, wherein if said subset is determined to be empty, said step of replacing in a manner that improves coverage further comprises the step of replacing an assigned level index in said row with an indicator.

13. A computer system comprising a processor; memory; a monitor; an input device; and a configuration generator tool application for developing testing configurations, said configuration generator tool being executable by said computer system and being operable to receive input data including a number of factors to be tested and levels for each factor from a user via said input device, said configuration generator tool being further operable to select from a group of Hadamard matrices stored in said memory of said computer a Hadamard matrix, each of such Hadamard matrices in said group being such that for any integer 1, 2 ... n, said Hadamard matrix has a size $2^n$ and at least $(2^n-1)$ columns, and maintains orthogonality of at least strength n when columns are selected sequentially, said configuration generator tool being further operable to create a testing configuration matrix from said selected Hadamard matrix;

wherein said configuration generator tool is further operable to create said testing configuration matrix by first creating an integer matrix from said selected Hadamard matrix by assigning different columns of said Hadamard matrix to represent different factors, wherein for factors having more than two levels a number X of consecutive columns of said Hadamard matrix are assigned to said factors such that X is the smallest integer for which ($2^X \geq$ the number of levels) for that factor, and for each factor assigning a level index to each level and assigning a different binary code to each level index, and inserting in a corresponding column and row of said integer matrix said level index assigned to said binary codes appearing in said Hadamard matrix;

wherein said configuration generator tool is further operable to create said testing configuration matrix by inserting an indicator in said integer matrix for each binary code appearing in said Hadamard matrix that is not assigned to a level index.

14. The computer system according to claim 13, wherein said integer matrix is an initial integer matrix, and said configuration generator tool is further operable to create said configuration matrix by replacing each indicator in said initial integer matrix with a selected assigned level index for the corresponding factor, wherein said initial integer matrix becomes a final integer matrix when all such indicators have been replaced.

15. The computer system according to claim 14, wherein said configuration generator tool is further operable to create said testing configuration matrix by, for each row of said initial integer matrix having an indicator, replacing said row having an indicator with a possible replacement level combination in a manner that improves testing coverage.

16. The computer system according to claim 15, wherein said configuration generator tool is further operable to replace said rows having an indicator in a manner that improves coverage by determining a subset of all possible replacement level combinations for said row containing said at least one indicator.

17. The computer system according to claim 16, wherein said configuration generator tool is further operable to replace said rows having an indicator in a manner that improves coverage by obtaining a frequency matrix count for each possible replacement level combination, and selecting each possible replacement level combination having a lowest frequency matrix count.

18. The computer system according to claim 17, wherein if more than one possible replacement level combination is selected then said configuration generator tool is further operable to replace said rows having an indicator in a manner that improves coverage by obtaining a proportionality matrix count for each selected possible replacement level combination, and choosing each possible replacement level combination having a lowest proportionality matrix count.

19. The computer system according to claim 18, wherein if more than one possible replacement level combinations are chosen, then said configuration generator tool is further operable to replace said rows having an indicator in a manner that improves coverage by choosing a single one of said chosen possible replacement level combinations.

20. The computer according to claim 19, wherein said configuration generator tool is further operable to replace said row of said initial integer matrix with said selected or chosen possible replacement level combination.

21. The computer system according to claim 20, wherein said configuration generator tool is further operable to update said frequency and proportionality matrices.

22. The computer system according to claim 21, said configuration generator tool being operable to calculate coverages based on said final integer matrix, and create a coverage matrix containing said calculated coverages.

23. The computer system according to claim 22, said configuration generator tool being operable to receive input data including excluded level combinations, and to replace rows of said initial integer matrix containing excluded level combinations in a manner that improves testing coverage.

24. A method for creating a testing configuration matrix comprising the steps of:
identifying factors to be tested and levels for each factor;
selecting a Hadamard matrix;
creating an initial integer matrix from said selected Hadamard matrix by assigning different columns of said Hadamard matrix to represent different factors, wherein for factors having more than two levels a number X of columns of said Hadamard matrix are assigned to said factors such that X is the smallest integer for which ($2^X \geq$ the number of levels) for that factor; and for each factor, assigning a level index to each level and assigning a different binary code to each level index, and inserting at the corresponding column and row in said integer matrix said level index assigned to said binary codes appearing in said Hadamard matrix;
inserting an indicator in said initial integer matrix for each binary code appearing in said Hadamard matrix that is not assigned to a level index; and
using a frequency matrix and a proportionality matrix to replace each row of said initial integer matrix having an indicator in a manner that improves testing coverages.

25. The method according to claim 24, further comprising the steps of, for each row of said initial integer matrix having an indicator, determining a subset of all possible replacement level combinations; and removing from said subset all possible replacement level combination not having a lowest frequency matrix count.

26. The method according to claim 25, wherein if one possible replacement level combination remains in said subset then said remaining possible replacement level combination is chosen, and wherein if more than one possible replacement level combination remains in said subset, then said method further comprises the step of removing from said subset all possible replacement level combinations not having a lowest proportionality matrix count.

27. The method according to claim 26, wherein if one possible replacement level combination remains in said subset then said remaining possible replacement level combination is chosen, and wherein if more than one remains in said subset, then said method further comprises the step of choosing a selected one of said remaining possible replacement level combinations.

28. The method according to claim 27, further comprising the step of replacing said row of said initial integer matrix with said chosen possible replacement level combination.

29. The method according to claim 28, wherein when each row of said initial integer matrix having an indicator has been replaced with its corresponding chosen possible replacement level combination, said initial integer matrix becomes a final integer matrix.

30. The method according to claim 29, further comprising the steps of calculating coverages based on said final integer matrix; and creating a coverage matrix containing said calculated coverages.

31. The method according to claim 30, wherein said Hadamard matrix is such that for any integer 1, 2 . . . n said Hadamard matrix has a size $2^n$ and at least ($2^n-1$) columns, and maintains orthogonality of at least strength n when columns are selected sequentially.

32. A method for creating a testing configuration matrix for a product having multiple components in which at least two possible selections are capable of being selected for each of the multiple components, comprising the steps of:
identifying factors to be tested, wherein the factors represent components of the product having at least two possible selections;
identifying levels for each factor, wherein the levels represent possible selections for each factor;
selecting a Hadamard matrix such that for any integer 1, 2 . . . n, said Hadamard matrix has a size $2^n$ and at least ($2^n-1$) columns, and maintains orthogonality of at least strength n when columns are selected sequentially; and
creating a testing configuration matrix from said selected Hadamard matrix.

33. A method according to claim 32, wherein said creating step comprises the steps of first creating an integer matrix from said Hadamard matrix by assigning different columns of said Hadamard matrix to represent different factors, wherein for factors having more than two levels a number X of consecutive columns of said Hadamard matrix are assigned to said factors such that X is the smallest integer for which ($2^X \geq$ the number of levels) for that factor; for each factor, assigning a level index to each level and assigning a different binary code to each level index; and inserting in the corresponding column and row of said integer matrix said level index assigned to said binary codes appearing in said Hadamard matrix.

34. A computer system comprising a processor; memory; a monitor; an input device; and a configuration generator tool application for developing testing configurations, said configuration generator tool being executable by said computer system and being operable to receive input data including a number of factors to be tested and levels for each factor from a user via said input device, wherein the factors represent components of a product to be tested, wherein each of the factors includes at least two possible selections, wherein the levels represent possible selections for each factor, said configuration generator tool being further operable to select from a group of Hadamard matrices stored in said memory of said computer a Hadamard matrix, each of such Hadamard matrices in said group being such that for any integer 1, 2 . . . n, said Hadamard matrix has a size $2^n$ and at least ($2^n-1$) columns, and maintains orthogonality of at least strength n when columns are selected sequentially, said configuration generator tool being further operable to create a testing configuration matrix from said selected Hadamard matrix.

35. The computer system according to claim 34, wherein said configuration generator tool is further operable to create said testing configuration matrix by first creating an integer matrix from said selected Hadamard matrix by assigning different columns of said Hadamard matrix to represent different factors, wherein for factors having more than two levels a number X of consecutive columns of said Hadamard matrix are assigned to said factors such that X is the smallest integer for which ($2^X \geq$ the number of levels) for that factor, and for each factor assigning a level index to each level and assigning a different binary code to each level index, and inserting in a corresponding column and row of said integer matrix said level index assigned to said binary codes appearing said Hadamard matrix.

* * * * *